United States Patent [19]

Hounsfield

[11] 4,322,684

[45] Mar. 30, 1982

[54] IMAGING SYSTEMS

[75] Inventor: Godfrey N. Hounsfield, Newark, England

[73] Assignee: E M I Limited, Hayes, England

[21] Appl. No.: 91,808

[22] Filed: Nov. 6, 1979

[30] Foreign Application Priority Data

Nov. 16, 1978 [GB] United Kingdom ............... 44809/78

[51] Int. Cl.$^3$ ..................................... G01N 27/00
[52] U.S. Cl. ................................................. 324/309
[58] Field of Search ............... 324/300, 307, 309, 311, 324/313, 314

[56] References Cited

U.S. PATENT DOCUMENTS 4,115,730 9/1978 Mansfield ............................ 324/309

OTHER PUBLICATIONS

Magnetic Resonance Zeugmatography, by P. C. Lauterbur, Jour. Pure and Applied Chem., 40, 1974, pp. 149–157.

P. C. Lauterbut, Medical Imaging by NMR Zeugmatography, IEEE Trans. on Nuclear Sci., vol. NS-26, No. 2, 2808–2811.

Primary Examiner—Michael J. Tokar
Attorney, Agent, or Firm—Fleit & Jacobson

[57] ABSTRACT

The invention provides an NMR machine capable of a volume scan. Initial data is provided for a plurality of planes in the body, instead of a plurality of lines as previously, and this is repeated at different positions rotated about an axis parallel to the plane. Convolution processing thus yields data for a matrix of lines parallel to that axis. Further rotation about the z-axis and repetition of the previous analysis at each stage yields data for such matrices of lines at different angles to the z-axis and further convolution processing provides data for a three-dimensional matrix of elements in the body. The last mentioned processing may be done in individual ones of parallel planes.

12 Claims, 20 Drawing Figures

IMAGING SYSTEMS

The present invention relates to systems for providing images of distributions of a quantity, in a chosen region of a body, by gryomagnetic resonance, particularly nuclear magnetic resonance (NMR) techniques. Such techniques may be used for examining bodies of different kinds. A particularly beneficial application is the examination of patients for medical purposes.

It has been proposed that nuclear magnetic resonance be used to provide distributions of water protons or other molecules or relaxation time constants in sectional slices or volumes of patients. It is particularly beneficial to perform the examination to provide data which can be analysed by techniques similar to those known for distributions of X-ray attenuation provided by computerised tomography (CT) systems.

An apparatus for, and method of achieving this, and improvements thereto, have been described and claimed in our co-pending U.S. patent application Nos. 41424, 39650, 40289, 39649 and 48777. In that arrangement a steady axial magnetic field is applied during the examination. This combines with various gradient fields to cause resonance in selected regions of the body. In the particular embodiment described the selected region is a planar slice and the examination may be repeated for further such slices.

It is an object of this invention to adapt the arrangement for use with larger volumes of the body. In the particular embodiment described the selected region is a planar slice and the examination may be repeated for further such slices.

It is an object of this invention to adapt the arrangement for use with larger volumes of the body.

According to the invention there is provided a method, of examining a body by means of nuclear magnetic resonance, including (a) exciting resonance in a plurality of substantially parallel planar slices of said body and deriving a resonance signal for each of said slices, (b) repeating step (a) for slices rotated through a plurality of different angles about a first axis substantially parallel to the planes thereof.

(c) processing the derived resonance signals to provide integrals of a quantity related to said resonance for each of a plurality of lines parallel to said first axis, (d) repeating steps (a), (b) and (c) for slices rotated through a plurality of different angles about a second axis substantially perpendicular to said first axis.

(e) processing the integrals for lines at each of said second mentioned angles to obtain measurements of said quantity in each element of a three dimensional matrix of elements in said body.

In order that the invention may be clearly understood and readily carried into effect, it will now be described by way of example with reference to the accompanying drawings of which.

Nuclear magnetic resonance techniques are generally used to analyse distributions of protons of water molecules in a body. They can, however, be used to analyse other molecules.

Molecules subject to a magnetic field have a resonant frequency related to the value of the field. Then, by application of an RF magnetic field at the resonant frequency, they can be excited and the excitation allowed to decay. The decay causes an induced signal at the resonant frequency in suitable coils around the body.

In the arrangement described in the aforesaid applications, the magnetic field is adjusted to have different values in different parts of the body. Only those parts having a resonant frequency equal to the frequency of the RF field are excited.

Figure 1:
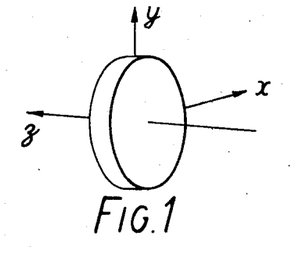
FIG. 1 shows a slice examined by a prior NMR method.
Figure 2:
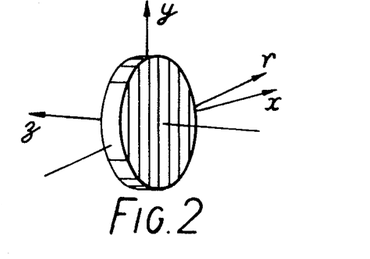
FIG. 2 shows how the slice of FIG. 1 is examined by resonance in parallel strips of the slice.

The basic magnetic field is in the z direction, usually coaxial with a patient's body and can be called $H_{zo}$ if all fields in that direction are referred to as $H_z$. A further $H_z$ field Gz is applied to have a gradient in the z-direction so that $Gz = \partial Hz/\partial z$. This provides a unique total field value in a chosen cross-sectional slice of the patient shown as in FIG. 1. A rotating RF field $H_1$, of frequency chosen to cause resonance in the selected slice is then applied. Thus only the molecules in the slice resonate. The resonance signal from the slice can then be detected. However, as it is detected there is applied a further field, $Gr = \partial Hz/\partial r$, which is in the z-direction but has a gradient in a direction r perpendicular to z. This causes phase dispersion of the resonance in the r-direction and consequent dispersion of the resonance signal detected. Frequency analysis of this signal, preferably by Fourier Transformations, yields a plurality of resonance signals each for a different one of a plurality of strips in the chosen slice perpendicular to r, as shown in FIG. 2.

Now for analysis by the well known CT X-ray techniques this procedure is repeated for many different directions of r to provide a plurality of sets of signals for sets of strips in different directions each perpendicular to its respective direction of r. In practice Gr is provided as the sum of Gx ($=\partial$ Hz/$\partial$ x) and Gx ($=\partial$ Hz/$\partial$ y) gradients, where x, y and z are orthogonal directions and the relative magnitudes of these components are varied to change the direction of r. Between taking each set of readings at different directions of r the spins of the molecules are rephased and the excitation by Gz and $H_1$ is repeated. Rephasing may be achieved by waiting until relaxation achieves the desired effect. However, in the interests of a more rapid examination, it may be achieved by repeating the pulse sequence in inverse sense as described in copending application No. 41424 which is incorporated herein by reference. Further signals may be sensed during the repetition. They should be identical to those already sensed but will improve the signal to noise ratio. Spin-echo techniques may also be used.

Figure 3:
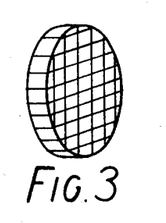
FIG. 3 shows, for the prior method, the matrix for which data is obtained.

The X-ray type analysis of the data for these strips in different directions results in values of water content in individual elements of a matrix of elements in the slice, the elements being defined by the procedure used and not by the body physiology. This is as indicated in FIG. 3 although in practice there are many more than shown, say 256×256, as there are more strips in each set than shown in FIG. 2.

It has been found that in application of this technique the receiving coils, as described in the aforesaid applications, accept noise from substantially the whole of the body although useful signals are obtained only from the single examined slice. It is therefore proposed in this invention to obtain signals simultaneously from a volume equivalent to many slices, therefore increasing the useful signal but not the noise, and to analyse them to provide information for many slices.

Figure 4:
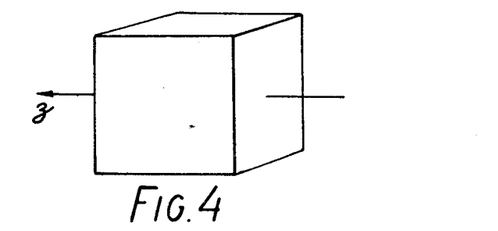
FIG. 4 shows the volume examined by the present method.
Figure 5:
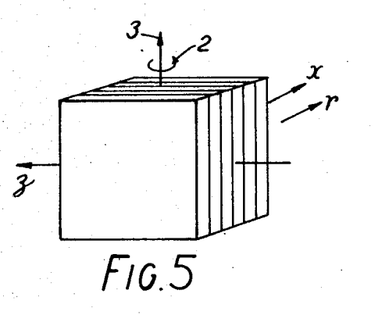
FIG. 5 shows how the volume is divided into parallel slices in which resonance is excited.

The procedure to be followed is in many respects similar to that described hereinbefore. However, since it is not required to limit resonance to a single slice it is theoretically not necessary to apply a Gz gradient for slice definition. In practice it is not desired that excitation should be extended to $\pm \infty$ in the z-direction, for example because of possible 'aliasing problems', and for that reason a weak $G_z$ gradient field is applied to limit resonance to a volume of interest which is, in effect, a very thick slice. Such a slice is shown in FIG. 4. In practice, of course, this would be a thick slice with the cross-section of the body being examined, approximately a cylinder. However, for clarity and ease of understanding in this and subsequent figures, it is useful artifice to illustrate it as a cubical volume. The cube can be considered as an examined volume in space in which the body lies. The Gr field is now applied as before and the result is that the volume of FIG. 4 is divided into a plurality of planes, each resonating at a different frequency, equivalent to the strips of FIG. 2. This is shown in FIG. 5. Resonance signals are then obtained as before for each of these planes by the Fourier transform procedure.

Figure 6:
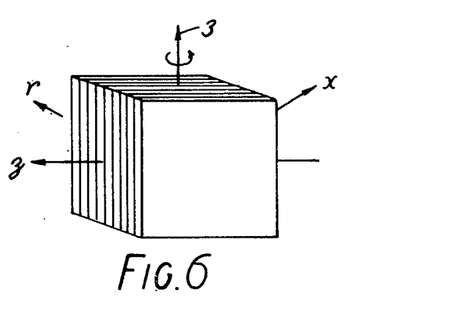
FIG. 6 shows one step in the rotation of said slices.
Figure 7:
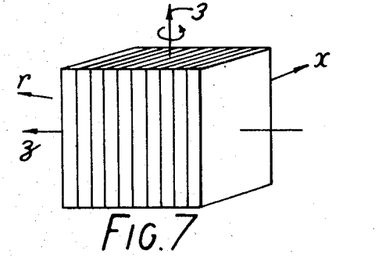
FIG. 7 shows a further step in the rotation.
Figure 8:
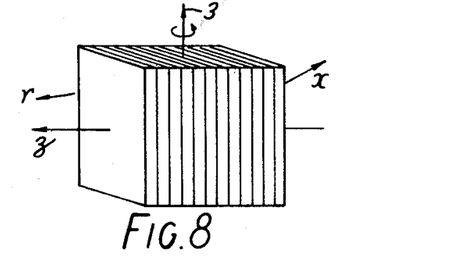
FIG. 8 shows a yet further step in the rotation.

However, unlike the previous procedure, before the gradient Gr is rotated in the xy plane it is rotated in a direction perpendicular to that, as shown by the arrow 2 in FIG. 5. This is achieved by maintaining Gx and Gy constant but by introducing and varying a Gz component of Gr. This is similar to the Gz component already applied, apart from the variation and can be applied on the same coils provided the dimensions are suitable. Additional coils can be used. Rotation is over 180° in, say 200 steps and resonance signals for the complete set of planes are derived at each of the 200 positions. Some of these positions are shown in FIGS. 6, 7 and 8. Clearly the 180° position will be identical to the 0° position and will not be required.

All of the data for these 200 rotational positions is then processed preferably by the known CT X-ray techniques as described before. The processing does not differ from that previously used. However, as the data are for planes and not strips, the data resulting from the processing will be for strips, all parallel to the axis of rotation 3, rather than for small elements as in FIG. 3.

Figure 9:
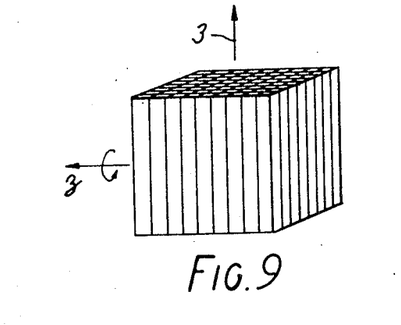
FIG. 9 shows a matrix of strips in the volume for which data is obtained.

FIG. 9 shows how the cubical body assumed so far is divided into strips, for each of which a total water content has now been derived. Once again, in reality, rotation of the cube of FIGS. 4 to 6 should result in FIG. 9 being a cylinder parallel to axis 3. However, for clarity in the subsequent figures, it will again be assumed to be a cube. This can be visualised as a cube selected from the said cylinder.

The procedure described so far to achieve data in this form is similar to that proposed by Lauterbur in Pure and Applied Chem. 40, 1974 pp 149–157. Lauterbur does not, however, give more than general indications that further processing may be performed on this data.

Figure 10:
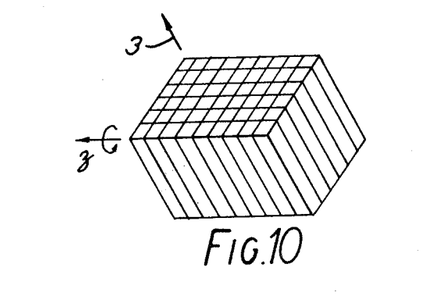
FIG. 10 shows a similar matrix at a step in a further rotation.
Figure 11:
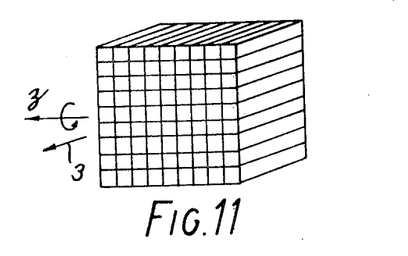
FIG. 11 shows a matrix at a further step in that rotation.
Figure 12:
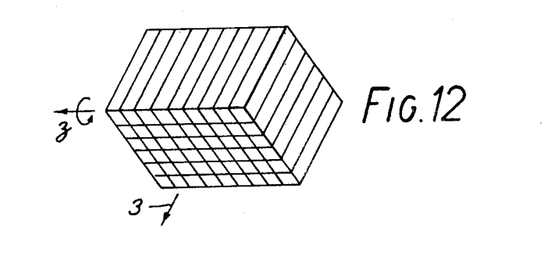
FIG. 12 shows a matrix at a yet further step in that rotation.

For the arrangement of this invention, to complete the examination procedure the Gx and Gy components are varied so as to rotate the axis 3 around the z-direction. This rotation is achieved through 180° in, say, 200 steps, and for each of these 200 stages the preceding procedure (rotation of direction r about axis 3° through 180°, sensing at 200 positions and analysis into strips, each as in FIG. 9) is repeated. Thus data for 200 sets of strips, each as in FIG. 9, are obtained, all strips in each set being parallel and different sets being at different angles relative to the z-axis. Three of the 200 stages of this rotation are shown in FIGS. 10, 11 and 12.

Figure 13:
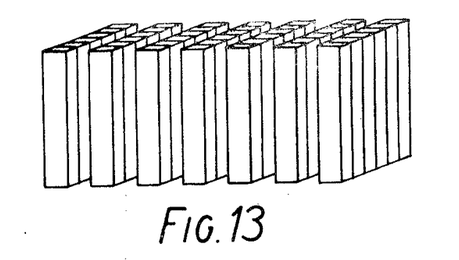
FIG. 13 shows how the matrix of FIG. 9 can be divided into planar parts.

It will be apparent that each cube of strips evaluated at one position of the last mentioned rotation can be considered as a set of planes of the same thickness as one strip and each divided into individual strips across its width. FIG. 13 shows a cube, similar to that of FIG. 9, exploded to illustrate that configuration. Thus as the rotation about the z-axis proceeds, each such plane is rotated about that axis and the data provided for each plane are the same as those obtained as the strips of FIG. 2 are rotated about the z-axis. Thus they each may be processed by the known CT X-ray method to provide data for a plurality of parallel planar matrices of elements, each like that of FIG. 3, as shown in exploded form in FIG. 14. Each of these matrices can be displayed individually as a cross-sectional slice view of the patient or they can be displayed together as a volume view. Of course, the data obtained during rotation about the z-axis may be processed together as a three dimensional processing if desired.

Figures 15, 16:
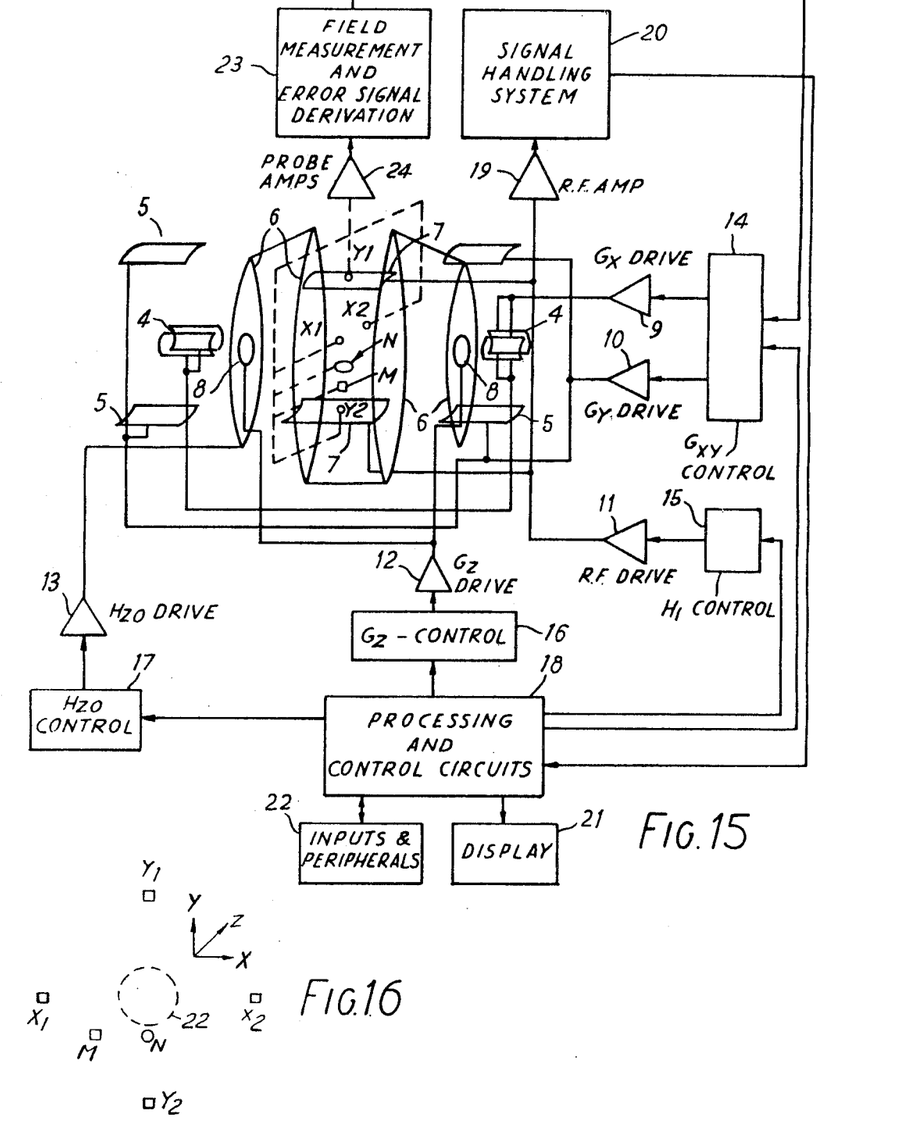
FIG. 15 shows a typical NMR apparatus which may be used to implement this invention.
FIG. 16 shows a distribution of field measuring coils for the apparatus of FIG. 15

FIG. 15 shows in simplified form the NMR apparatus of the type described in the aforesaid copending Patent applications. Illustrated, schematically only, are coils 4, which provide the Gx component of $G_R$, 5, which provide the Gy component of $G_R$, 6, which provide the steady $H_{zo}$ field, 7, which provide the rotating H1 (RF) field, and 8, which provide the $G_z$ field gradient. The coils are driven by $G_x$, $G_y$, RF($H_1$), $G_z$ and $H_{zo}$ drive amplifiers 9, 10, 11, 12 and 13 respectively, controlled by $G_{xy}(G_R)$, $H_1$, $G_z$ and $H_{zo}$ control circuits 14, 15, 16 and 17 respectively. These circuits can take suitable forms which will be well known to those with experience of NMR equipment and other apparatuses using coil induced magnetic fields. The circuits are controlled by a central processing and control unit 18 to achieve a desired pulse sequence.

The signal sensed, during the $G_R$ field application, is received in this example by the $H_1$ coils 7 and is amplified by an RF amplifier 19 before being applied to signal handling circuits 20. In certain circumstances it may be preferable to provide separate coils specifically designed for the purpose, to sense the signal. The circuits 20 are arranged to make any appropriate calibrations and corrections but essentially transmit the signals, which are effectively proton density values for strips in the body, to the processing circuits to provide the required representation of the examined slice. These circuits can be specially designed to implement the CT type processing, for example the convolution process described and claimed in British Pat. No. 1,471,531. It is, however, advantageous to implement the processing by a suitably programmed digital computer. This computer can also conveniently control the pulse sequence and thus represents the circuits indicated at 18. The picture thus obtained is viewed on a display 21, such as a television monitor, and this may include inputs and other peripherals 22 for the provision of commands and instructions to the machine, or other forms of output.

The apparatus also includes field measurement and error signal circuits 23 which receive signals via amplifiers 24 from field probes $X_1$, $X_2$, $Y_1$, $Y_2$, N and M shown. The positions of the probes, in relation to the examined slice of the body 25 of the patient, are further shown in FIG. 16. $X_1$, $X_2$, $Y_1$ and $Y_2$ are in this example conventional YIG (yttrium-iron-garnet) tuned oscillator field measuring probes. The probes give measure of the fields, at the points at which they are situated, as oscillations with frequency proportional to the field intensity. The values measured are therefore obtained by a count of the oscillations in a set time. In practice the YIG probes can oscillate in different modes and it is necessary to determine the mode in operation. For this purpose there are provided NMR probes M & N. These probes are simply miniature cells of pure water (such as a closed test tube) surrounded by a small coil. Preferably the water is doped to have a suitable value of $T_1$ relaxation time-constant. The probes give a reliable resonance of 4.26 $kH_z$/Oe and can be used to check the YIG tuned oscillator modes. They are, however, of insufficient spatial resolution to be used to replace the YIG probes for gradient field measurement. Probe N, fixed in space, acts as a reference. A movable NMR probe M may be moved adjacent the YIG probes in turn to provide data to determine their modes of oscillation, orientation and other characteristics. Other types of probe may be used as desired.

The apparatus so far described is essentially that disclosed in the said co-pending applications. It may readily be adapted to implementation of the present invention by adapting the sequencing control of the coil drives to achieve the examination sequence described hereinbefore.

Figure 17:
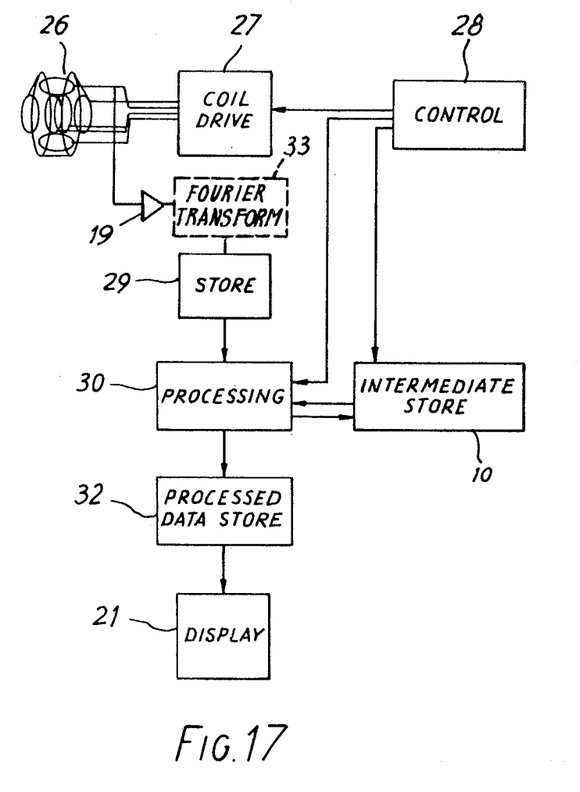
FIG. 17 shows an apparatus for implementing the invention.

Part of the adaptation to this invention can be seen in the simplified block diagram of the overall NMR system shown in FIG. 17. The coil system is indicated generally at 26. This need not differ from that known for two dimensional examinations for example as described in the said patent application, provided the field generating coils are large enough and sufficiently accurately constructed or controlled to give uniform fields over the volume which it is desired to examine. Similarly, the signal sensing coils should be of sufficient dimension, typically these are also the $H_1$ field coils. The coils are driven by field drive units indicated generally at 27 in response to the control part of circuits 18, shown at 28.

The signals received from the sensing coils are amplified in the RF amplifier 19, stored in a store 29 until a full set has been accumulated and processed in a processor 30 which is arranged to process data received in the manner of the said CT X-ray processing. The processor 9 may be identical with those used in CT X-ray equipment with minor consequential amendments. Each time a rotation is achieved about axis 3 (FIGS. 5–8) the processed data is stored in an intermediate store 31. After the rotations about axis 3 for all rotation positions about the z-axis have been followed, all of the first processed data is drawn from store 31, in this example one slice at a time (FIG. 13) and further processed in processor 30 in the same manner as previously. All of the twice processed data is then stored in a store 32 for display at 21. As explained hereinbefore, the signals from amplifier 19 have to be Fourier transformed before the processing described. This may conveniently be accomplished also in the processor 30, but a conventional Fourier transform circuit (33) may be inserted between 19 and 29 if desired. The circuit 29–33 are incorporated in signal handling and processing 20 and 18 of FIG. 15.

The control unit 28 is merely required to ensure that the units are caused to perform the steps described hereinbefore in the proper order and for predetermined times, as known for NMR apparatus. To that end, control 28 is essentially a programmed clock which sends pulses to switch individual units on and off at predetermined times. Such units are well known. It may, however, perform other functions, such as calibration and further refinements of processing, if desired.

Figure 18:
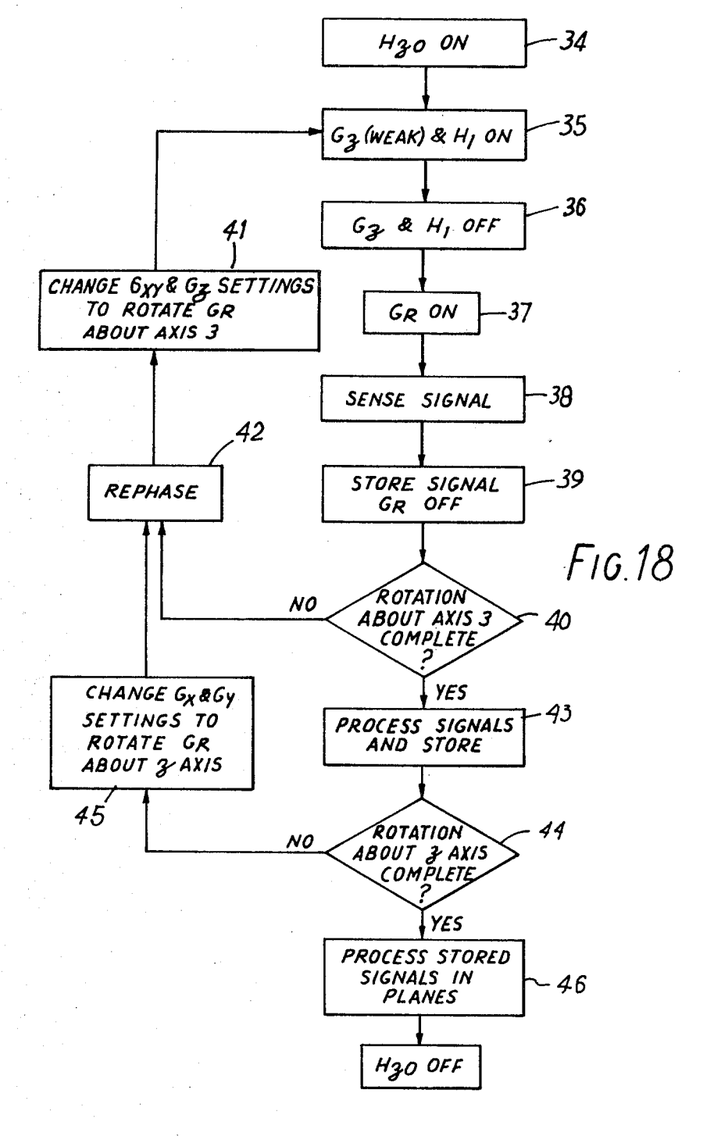
FIG. 18 shows a flow diagram illustrating the coordinates used in explaining the invention.

FIG. 18 is a flow diagram which shows the stages as described hereinbefore for one example of the invention. Modifications may, of course be made to this sequence within the scope of the invention.

Figures 19, 20:
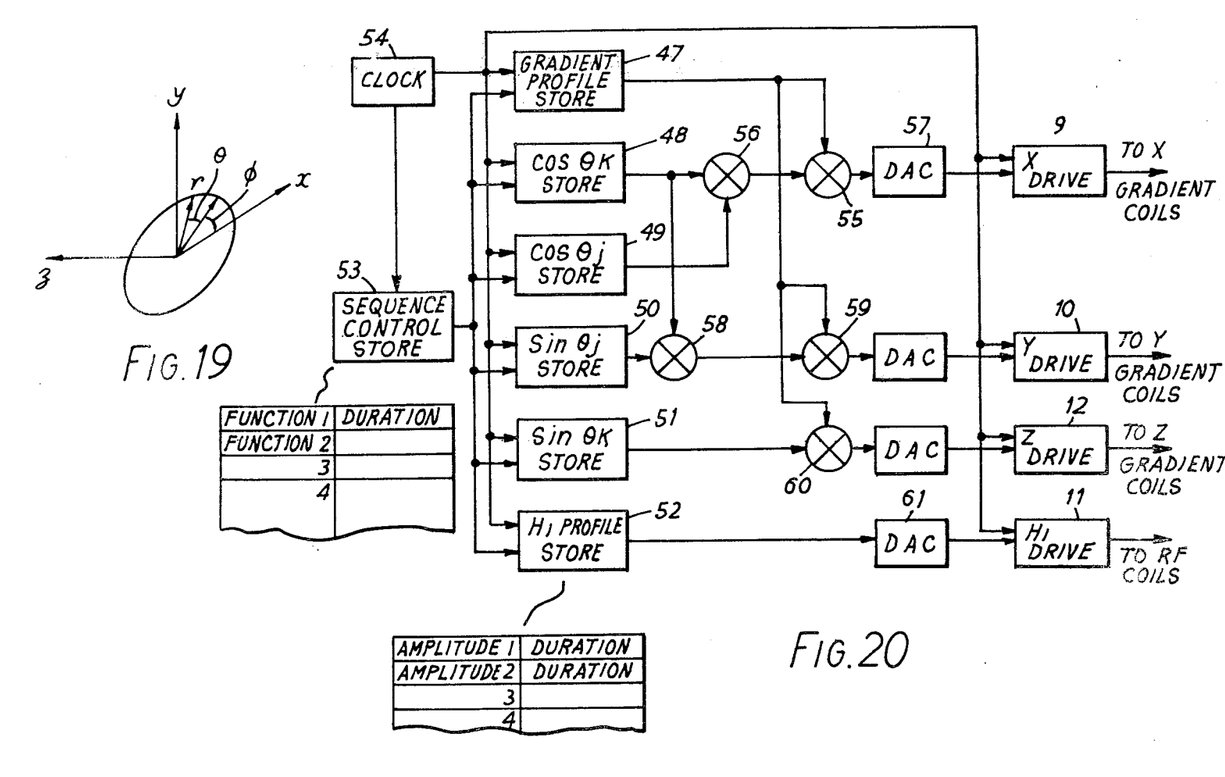
FIG. 19 illustrates the coordinates of the rotations followed and FIG. 20 shows a block diagram of a circuit for providing the correct sequence and magnitudes of field gradient pulses.

The flow diagram is generally self explanatory and will only be briefly discussed with reference also to FIG. 19 which shows the relevant coordinates.

In the presence of the $H_{zo}$ field (34), the volume is excited with a $\pi/2$ RF·($H_1$) pulse (35–36) to rotate the vectors into the x-y plane. The required $G_R$ is then applied (37,39).

As mentioned hereinbefore, it has been the practice to provide a $G_R$ field gradient as suitable proportions of orthogonal Gx and Gy field gradients. In this invention $G_R$ moves in three dimensions and therefore is provided by suitable proportions of these orthogonal field gradients Gx, Gy and Gz.

Initially it will be assumed that $G_R$ is aligned with the x-axis and it is then provided by Gx and with Gy and Gz being zero.

The first rotation is about the y-axis (vertical in FIG. 19) through an angle $\theta$ and the new $G_R$ is provided by Gx=$G_R$ cos $\theta$, Gy=0 and Gz=$G_R$ sin $\theta$. During the application of the $G_R$ gradient the NMR signal is sensed (38). This procedure is repeated (40,41) to rotate $G_R$ about axis 3 (FIGS. 5 to 8) with suitable rephasing at each stage (42). The signals obtained in the course of this rotation are then processed (43) to give signals for the strips parallel to axis 3 (of course these signals may be stored and this processing stage delayed until all signals have been measured). The $G_R$ gradient is then rotated about the z axis (44,45) through an angle $\phi$ in the x-y plane and the rotation about axis 3 is repeated. This is shown in FIG. 19 as a rotation of towards the Z-axis of the locus swept by vector r in its rotation through $0 < \theta < 360°$. The required field gradients are then given by the more general formulae:

$$G_x = G_R \cos\theta \cos\phi, \quad G_y = G_R \cos\theta \sin\phi,$$
$$G_z = G_R \sin\theta$$

and rotation for block 41 generally involves changes in all three orthogonal gradients.

Figure 14:
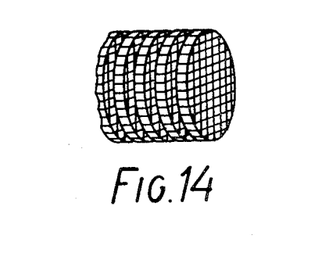
FIG. 14 shows planar two dimensional matrices for which data is derived, from planar parts at different angles from FIGS. 9 to 12.

When all rotations through $\phi$ have been completed the processed signals from step 43 are reprocessed in the same manner (46) to give the slice analysis shown in FIG. 14.

From the foregoing description it will be appreciated that the principal changes required to known NMR imaging apparatus to implement this invention, reside in the temporary storage of the once processed signals to make a second passage of the otherwise identical processing circuits (or through a further similar circuit) and the provision of the three dimensional gradient pulses. FIG. 20 shows a block diagram of a circuit for providing the correct sequence and directions of gradient and other pulses to the respective coils.

Since the examining procedure will in general be identical each time for one particular design of apparatus it is most convenient to determine by calculation, using the formulae set out hereinbefore, the required durations of the pulses. The operation is then controlled by these predetermined durations held in suitable stores, conveniently read only memories. In this embodiment one store, 47, holds a profile of amplitude against time for the desired $G_R$ pulse. The Gx, Gy and Gz pulses are formed by modification of this profile according to the current values of the angles $\theta$ and $\phi$ and to this end stores 48, 49, 50 and 51 hold respectively values of $\cos\theta$, $\cos\phi$, $\sin\phi$ and $\sin\theta$. Store 52 holds profiles for the $H_1$ (RF) pulses as a sequence of durations at different amplitudes. The sequence of operation of the various stores is determined as described and held in a store 53 as a sequence of different functions and their respective directions. All operations are times by pulses from a system clock 54. In operation the $G_R$ profile is multiplied at 55 by $\cos\theta \cos\phi$ (produced at multiplier 56) to give Gx which is applied via a digital to analogue converter (DAC) 57 to x-drive 9. Similarly $\cos\theta \sin\phi$ from 58 is multiplied by $G_R$ at 59 to give Gy for y-Drive 10 and $\sin\theta$ is multiplied by $G_R$ at 60 to give Gz for z-drive 12. the $H_1$ profile is provided via only its DAC 61 to $H_1$ drive 11.

It will be appreciated that a faster response may be obtained by avoiding the multiplications and storing all values of each $G_R$ component in respective stores for each different angle. This would, however, require a much greater storage capacity. Other embodiments may be derived if required for operation of the invention as explained hereinbefore.

I claim:

1. A method, of examining a body by means of nuclear magnetic resonance, including:
   (a) inducing resonance in a plurality of substantially parallel planar slices of said body and deriving a resonance signal for each of said slices,
   (b) rotating said slices together through a predetermined plurality of angular steps about a first axis substantially parallel to the planes thereof and repeating step (a) after each of said angular steps,
   (c) processing the derived resonance signals to provide integrals of a quantity related to said resonance for each of a plurality of lines parallel to said first axis,
   (d) rotating said slices together through a predetermined plurality of further angular steps about a second axis substantially perpendicular to said first axis and repeating steps (a), (b) and (c) after each of said angular steps, and
   (e) processing the integrals obtained for lines after each of said further angular steps to obtain measurements of said quantity in each element of a three dimensional matrix of elements in said body.

2. A method according to claim 1 in which step (e) includes processing said integrals in groups, each group being of integrals for a plurality of sets of parallel lines, the lines of all of said sets in one group being substantially coplanar, and processing the integrals of each group to provide measurements of said quantity in elements of a two-dimensional matrix of elements notionally defined in the respective plane.

3. A method according to either of the preceding claims in which each of the said processing steps employs a method suitable for processing line integrals of a quantity passing through a region from a plurality of different directions to provide a distribution of the quantity in said region.

4. A method according to claim 1 wherein the said quantity is the density of protons in said body.

5. An apparatus for examining a body by means of nuclear magnetic resonance including means for inducing resonance in a plurality of substantially parallel planar slices of said body, means for deriving a resonance signals for each of said slices, means for causing the means for exciting to repeat the excitation for a set of parallel planes at a plurality of different orientations in said body and means for processing the resonance signals for said sets of slices to derive values of a quantity related to said resonance in elements of a three-dimensional matrix of elements notionally defined in said body.

6. An apparatus according to claim 5 in which the processing means is arranged to first process the signals into sets of signals for sets of parallel strips of different orientations in each of a plurality of parallel sections of said body and to further process the signals for each such section into values of said quantity for elements of a two dimensional matrix of said elements in the section.

7. An apparatus according to claim 5 in which the means for exciting is arranged to induce resonance in a plurality of slices at each of a plurality of angular orientations about one axis and to repeat the procedure for each of a plurality of angular orientations of the first axis about a second, orthogonal axis.

8. An apparatus according to claim 7 in which the means for processing is arranged to process the signals obtained during rotation about the first axis to provide integrals of said quantity for a plurality of strips parallel to that axis in a volume of the body for each angular position of said first axis and to process the said integrals to derive the said values for said elements.

9. A method of examining a body by means of nuclear magnetic resonance, including
   (a) Applying a rotating RF field to the body in the presence of a field gradient in a first direction to induce resonance in a volume of the body, (b) applying a second field gradient in a chosen direction to disperse said resonance in the chosen direction, (c) sensing a resonance signal for each of a plurality of sectional slices of said volume dispersed in the chosen direction, (d) repeating steps (b) and (c) for a plurality of different directions of the second field gradient, all of said directions being orthogonal to an axis parallel to said first mentioned slices, (e) repeating steps (a), (b), (c) and (d) for a plurality of different directions of said axis, all of said directions being orthogonal to a further axis in the volume, and (f) processing the resonance signals to provide measurements of a quantity related to said resonance for each of a plurality of elements in each element of a three dimensional matrix of elements notionally defined in said body.

10. A method according to claim 9 in which the resonance signals obtained in a single repetition of steps (a), (b), (c) and (d) are processed to derive values of said quantity for each of a plurality of parallel strips of said body parallel to said first mentioned axis, and the said values are subsequently processed for all directions of said axis to provide the values for said elements.

11. A method according to claim 9 or claim 10 in which the processing is by a method used in computerised tomographic X-ray analysis to process line integrals of X-ray absorption.

12. A method of examining a body by means of nuclear magnetic resonance including: inducing resonance in a three dimensional region of a body and deriving resonance signals for distinguishable parts of said region; by applying three orthogonal variable field gradients, effectively rotating the region at different rates about two orthogonal axes and repeating the step of exciting resonance and deriving resonance signals for a plurality of positions in said effective rotation; and processing the resonance signals to obtain measurements of a quantity, related to said resonance, in each of a plurality of element of a three dimensional matrix of elements in said body.

* * * * *